(12) United States Patent
Meijer et al.

(10) Patent No.: US 7,868,537 B2
(45) Date of Patent: Jan. 11, 2011

(54) POLYMER LIGHT-EMITTING DIODE WITH AN ION RECEPTOR LAYER

(75) Inventors: Eduard Johannes Meijer, Eindhoven (NL); Eric Alexander Meulenkamp, Eindhoven (NL); Ralph Kurt, Eindhoven (NL); Steve Klink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 726 days.

(21) Appl. No.: 11/814,377

(22) PCT Filed: Jan. 16, 2006

(86) PCT No.: PCT/IB2006/050142

§ 371 (c)(1), (2), (4) Date: Jul. 20, 2007

(87) PCT Pub. No.: WO2006/077514

PCT Pub. Date: Jul. 27, 2006

(65) Prior Publication Data

US 2009/0039766 A1   Feb. 12, 2009

(30) Foreign Application Priority Data

Jan. 21, 2005   (EP) .................................. 05100363

(51) Int. Cl.
*H01L 51/50* (2006.01)
*H01L 51/52* (2006.01)
*H01L 51/56* (2006.01)

(52) U.S. Cl. ........................................ 313/504; 445/24
(58) Field of Classification Search ...................... None
See application file for complete search history.

(56) References Cited

U.S. PATENT DOCUMENTS 5,682,043 A   10/1997   Pei et al.
2008/0224089 A1*   9/2008   Pei ............................. 252/62.2

FOREIGN PATENT DOCUMENTS

EP   0817539 A2   1/1998

OTHER PUBLICATIONS

Tae-Woo Lee et al: Ionic Materials to Improve Charge Injection in Polymer Electroluminescent Devices, Proceedings of the SPIE, Int. Soc. Opt. Opt. Eng. vol. 4991, 2003, pp. 144-151, XP002386228.

(Continued)

*Primary Examiner*—Toan Ton
*Assistant Examiner*—Britt D Hanley

(57) ABSTRACT

A light-emitting diode has a first electrode, a second electrode and a light-emitting layer. A receptor layer of an ion receptor has an affinity for ions of a first charge and is positioned between the first electrode and the light-emitting layer. A further layer includes immobile ions of a second charge and is positioned between the second electrode and light-emitting layer. The immobile ions initially have attached counterions of the first charge that move towards the receptor layer upon application of an electric field for capture by the receptor layer. Upon capture of the counterions, a concentration of immobilized ions of the first charge is formed at the first electrode yielding an ion gradient for injection of electrons and holes resulting in emission of light.

12 Claims, 9 Drawing Sheets

OTHER PUBLICATIONS

Gang Yu, et al: Polymer Light-Emitting Electrochemical Cells with Frozen p-i-n Junction at Room Temperature Advanced Materials, Wiley VCH, Weinheim, DE, vol. 10, No. 5, 1998, pp. 385-388, XP002360476.

Charles J. Pedersen et al; "Cyclic Polyethers and Their Complexes With Metal Salts", Journal of the American Chemical Society, vol. 89, No. 10, 7017, May 10, 1967.

Martijn M. G. Antonisse et al; "Neutral Anion Receptors: Design and Application", Chem. Comm. pp. 443-448, 1998.

H. S. Lee et al; "Synthesis of a New Family of Fluorinated Boronate Compounds As Anion Receptors and Studies of Their Use As Additives in Lithium Battery Electrolytes", Journal of Power Sources, vol. 97, 98, pp. 566-569, 2001.

Qibing Pei et al; "Polymer Light-Emitting Electrochemical Cells", Science, vol. 269, No. 1086, Aug. 25, 1995.

Jun Gao et al; "Polymer Light-Emitting Electrochemical Cells With Frozen P-I-N Junction", Appl. Pyhs. Letters, vol. 71, No. 10, pp. 1293-1295, Sep. 8, 1997.

Paul McCord et al; "Electrogenerated Chemiluminescence", J. Electroanal. Chem. vol. 91, No. 318, pp. 91-99, 1991.

J. B. Brzoska et al; "Silanization of Solid Substrates: A Step Toward Reproducibility", Langmuir, vol. 10, 1994, pp. 4367-4373.

Masao Sugawara et al; "Ion-Channel Sensors", Anl. Chem. vol. 59, Dept. of Chemistry, Faculty of Science, Hokkaido Univ., Sapporo, Japan, 1987, pp. 2842-2846.

Choi et al: "Tailoring of Self-Assembled Monolayer for Polymer Light-Emitting Diodes"; Applied Physics Letters, vol. 79, No. 13, Sep. 24, 2001, pp. 2109-2111.

Huang et al: "Small Molecule Organic Light-Emitting Diodes Can Exhibit High Performance Without Conventional Hole Transport Layers"; American Institute of Physics, 2002, pp. 3528-3530.

Huang et al: Enhanced Performance of Blue Light Emitting Polymer Diodes Via Anode Modification (22103, et al), 2 page Document, Downloaded FROMF http://ttp.northwester.edu/abstracts/viewlabs.php?id=181&cat=90, Sep. 28, 2004.

* cited by examiner

POLYMER LIGHT-EMITTING DIODE WITH AN ION RECEPTOR LAYER

FIELD OF THE INVENTION

The present invention relates to a light-emitting diode comprising a first electrode, a second electrode and a light-emitting layer being positioned between the two electrodes.

The present invention also relates to a method of forming a light-emitting diode having a first electrode, a second electrode and a light-emitting layer being positioned between the two electrodes.

BACKGROUND OF THE INVENTION

Polymer light emitting electrochemical cells (LEC), which are useful in, among other applications, organic electro-luminescent flat displays and large area light sources, have the function of providing light emission upon an applied voltage without the need for a sensitive low work function metal cathode, which is needed in normal polymer light emitting diodes (PLED). In an LEC a solid electrolyte provides, upon the application of a voltage, the ion gradients needed for the injection of electrons from the cathode also in cases where the cathode is not a low work function electrode. A problem with an LEC is that ion travel in the electrolyte makes the response slow. G. Yu et al have in their article "Polymer Light-Emitting Electrochemical Cells with Frozen p-i-n Junction at Room Temperature", which was published in Advanced Materials, 1998, 10, No. 5, page 385-388, proposed a solution to this slow response by providing an LEC having so called "frozen p-i-n junctions" and in practical operation working as a PLED. The frozen junctions were obtained by providing an electroluminescent polymer, mixing it with an electrolyte and sandwiching it between two electrodes to obtain a LEC. The LEC was heated to about 60-80° C. and then a voltage of about 3-4 V was applied. After the ion gradients had been generated the LEC was cooled to room temperature. The ion gradient became "frozen", i.e. the ions did not return to their normal position since their mobility was too low in the polymer in question at room temperature.

A disadvantage of the LEC according to G. Yu et al is that it is complicated to manufacture. Further it is sensitive to high temperatures, since an increased temperature would mean that the ions would start travelling again and would thus destroy the "frozen" ion gradients.

SUMMARY OF THE INVENTION

An object of the present invention is to provide a light-emitting diode having a quick response without the manufacturing costs and the large temperature sensitivity associated with the prior art LECs having "frozen" ion gradients.

This object is achieved by a light-emitting diode comprising a first electrode, a second electrode and a light-emitting layer being positioned between the two electrodes, the diode further comprising a layer of an ion receptor having affinity for ions of a first charge, the latter layer being positioned between the first electrode and the light-emitting layer, immobile ions of a second charge, being opposite to said first charge, the immobile ions being positioned between the first electrode and the second electrode at a distance from the layer of the ion receptor in the direction of the second electrode, and counterions having said first charge, the layer of the ion receptor having captured counterions, thereby forming a concentration of immobilized ions of the first charge at the first electrode, the ion gradient thus formed providing for injection of electrons and holes into the light-emitting layer when the light-emitting diode is exposed to a forward bias.

An advantage of this light emitting diode is that it provides a very quick response to an applied bias since the ion gradient is always in place and need not be generated as in the light-emitting electrochemical cells according to the prior art. A further advantage is that the ions are immobilized by means of a layer of an ion receptor layer. This makes the light-emitting diode according to the invention much less sensitive to high temperatures and time dependent degradation compared to the thermally "frozen" ion gradients of the prior art as described by G. Yu et al in the above mentioned article.

In relation to prior art LEDs a further advantage is that the present invention also enables the use of blue emitting polymers. Such polymers usually have a large band gap, which makes it difficult to match with the work function of the anode and/or of the cathode. With the ion gradient obtained in the present invention the injection of holes and/or electrons also into blue emitting polymers is enabled.

An advantage with the measure according to claim 2 is that it provides for an efficient generation of the desired ion gradient to obtain efficient injection of electrons from the cathode and of holes from the anode in forward bias.

An advantage with the measure according to claim 3 is that it provides for an efficient generation of the desired ion gradient to obtain efficient injection of electrons from the cathode and of holes from the anode in forward bias.

An advantage with the measure according to claim 4 is that it provides for an increased life of the diode, as it is less sensitive to attack of oxygen and water, and a large freedom of choice as regards the electrode materials. The large ion gradient in the present invention makes it possible to use a high work function material in that electrode, which is to be operated as cathode in forward bias. Thereby the often-encountered disadvantages of sensitivity to oxygen in low work function electrodes are avoided. If both electrodes are made from high work function materials the question of which is the cathode and which is the anode in forward bias is determined only by where the immobilized or immobile cations and where the immobile or immobilized anions are located.

An advantage of the measure according to claim 5 is that a layer of ionic self-assembled monolayer molecules provides for an even layer of immobile ions of the second charge. That layer could be positioned close to the second electrode providing a concentration of immobile ions of the second charge at the second electrode. Thereby an ion gradient is provided both at the first electrode and at the second electrode. Additionally the self-assembled monolayer molecules efficiently prevent the immobile ions of the second charge from migrating towards the immobilized ions of the first charge, since the self-assembled monolayer is fixed to the second electrode.

An advantage of the measure according to claim 6 is that molecules having a fixed ionic headgroup, a bonding group fixing the molecule to the second electrode, and an organic group holding the head group and the bonding group together at a distance from each other provides for the formation of even monolayers with the head groups pointing in the direction of the light-emitting layer.

An advantage of the measure according to claim 7 is that organic molecules are often well suited for application in thin layers, that often are at least semi-transparent, between an electrode and a light-emitting layer. Organic molecules can be synthesized in different shapes and can easily be made to form bulky structures that, due to their volume, cannot migrate through the matrix of the light-emitting layer.

An advantage of the measure according to claim 8 is that it provides for making thin, large area lighting appliances or flat display panels in which light emitted by the light-emitting diode is to be emitted via a large face of the diode.

An advantage of the measure according to claim 9 is that organic materials, which may be polymeric materials, but also organic molecules of substantially smaller size, are suitable for providing a solid electrolyte in which the movable counterions can travel during an initialisation step but in which the receptor molecules and the immobile ions cannot migrate. Polymeric materials provide suitable solid matrixes in which the counterions are mobile during the initialisation step. The polymeric materials are often transparent. The fact that the polymeric materials are solid, still permitting the mobility of the counterions, makes manufacturing and handling of the light-emitting diode easier.

Another object of the present invention is to provide an efficient way of manufacturing a light-emitting diode having quick response, still avoiding the temperature sensitivity associated with the prior art LECs having "frozen" ion gradients.

This object is achieved by a method of forming a light-emitting diode having a first electrode, a second electrode and a light-emitting layer being positioned between the two electrodes, the method comprising providing, between the first electrode and the light-emitting layer, a layer of an ion receptor having affinity for ions of a first charge, providing, between the first electrode and the second electrode, at a distance from the layer of the ion receptor in the direction of the second electrode, immobile ions of a second charge, being opposite to said first charge, and providing counterions having said first charge, and applying an electrical field over the electrodes to make one of said first electrode and said second electrode the cathode and the other of said first electrode and said second electrode the anode, such that the layer of ion receptor captures and immobilizes counterions thereby forming a concentration of immobilized ions of the first charge at the first electrode, the ion gradient thus formed providing for injection of electrons and holes into the light-emitting layer when the light-emitting diode is exposed to a forward bias.

An advantage of this method is that it provides for a simple method of manufacturing light-emitting diodes that have a quick response, a low sensitivity to high temperatures and a long expected life.

An advantage of the measure according to claim 11 is that an increased temperature makes the ion travel in the light-emitting layer quicker during the initialisation of the diode. This shortens the time needed to obtain the desired ion gradients making manufacturing quicker. A further advantage of this measure is that it also makes it possible to make use of polymers in which the ion travel is far too slow at room temperature.

BRIEF DESCRIPTION OF THE DRAWINGS

The invention will now be described in more detail with reference to the appended drawings in which.

DESCRIPTION OF PREFERRED EMBODIMENTS

Figure 1:
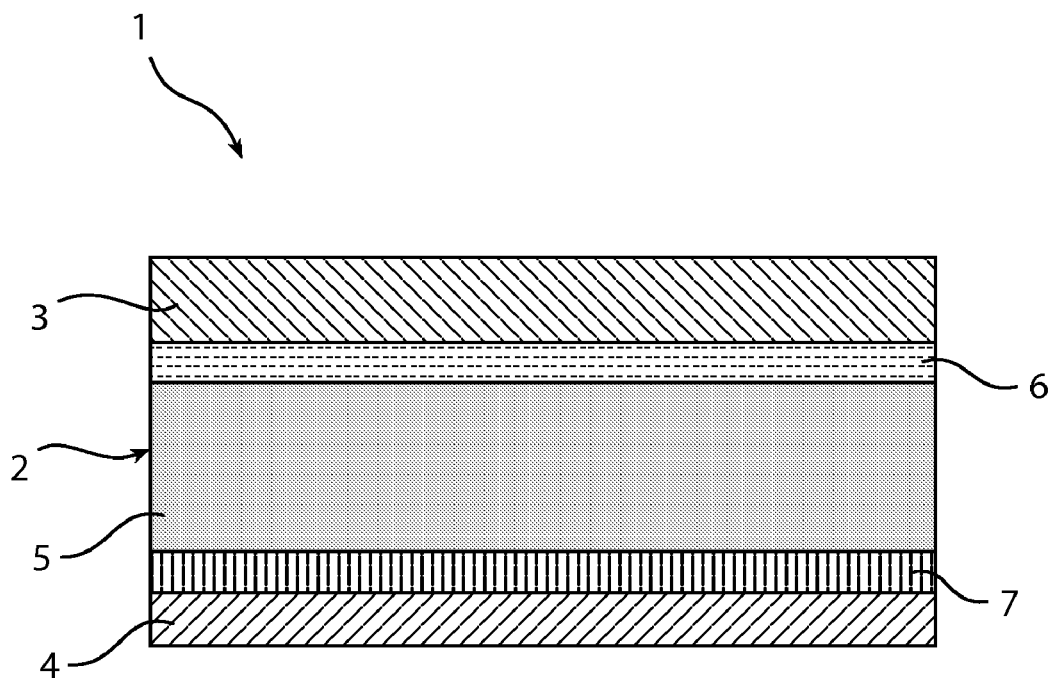
FIG. 1 is a schematic cross-section and shows a light-emitting diode according to a first embodiment of the invention.

FIG. 1 shows a light-emitting diode 1 according to the invention. The diode 1 has a laminate structure 2 and comprises a first electrode 3, a second electrode 4 and, positioned between the first electrode 3 and the second electrode 4, a light-emitting layer 5. The diode 1 is provided on a substrate (not shown in FIG. 1), which provides the diode 1 with mechanical support and includes the connections for the electrodes 3, 4.

The first electrode 3 works as a cathode when the diode 1 is subjected to an electrical field in forward bias. The first electrode 3 is made from a high work function material, for example gold, silver, aluminium or indium tin oxide (ITO). Examples of other alternative electrode materials could be found in, for example, the patent U.S. Pat. No. 5,682,043 to Pei et al. describing light-emitting electrochemical cells in general.

The second electrode 4 works as an anode when the diode 1 is subjected to an electrical field in forward bias. The second electrode 4 is made from an at least partly transparent, high work function electrode material, such as indium tin oxide (ITO). Other examples of alternative transparent electrode materials could be found in U.S. Pat. No. 5,682,043 (Pei et al).

In case the first electrode 3 is made of a transparent electrode material, such as ITO, the second electrode 4 need not necessarily be made of a transparent material, but could be made of, for example, gold, aluminium or another high work function metal electrode material.

The light-emitting layer 5 comprises a matrix, which is preferably a semiconducting polymeric material, such as a conjugated polymer or a co-polymer, which contains segments of p-conjugated moieties. Examples of suitable semiconducting polymeric materials can be found in the above-mentioned U.S. Pat. No. 5,682,043. The matrix could, as alternative, be made of another type of organic material, such as an organic material having substantially smaller molecular weight than the polymeric materials.

A layer 6 of a cation receptor is located between the first electrode 3 and the light-emitting layer 5. The layer 6 of cation receptor contains organic molecules that are bulky and that have affinity for cations, i.e. ions with a positive charge, as will be described later. The layer 6 of cation receptor has captured and immobilized a number of cations as will be described below. There is thus a high concentration of cations adjacent to the first electrode 3.

A layer 7 of ionic self-assembled monolayer molecules is located between the second electrode 4 and the light-emitting layer 5. The ionic self-assembled monolayer molecules each have a bonded ionic headgroup having a negative charge, thus being anions. Originally each headgroup had ionically bound thereto a counterion with a positive charge, i.e. a cation. During an initialisation phase, which will be described in more detail below, the layer 6 of cation receptor has captured the counterions and has left the layer 7 of ionic self-assembled monolayer molecules with only the headgroup having a negative charge. Thereby a self-assembled monolayer of immobile ions of the negative charge, anions, is formed at the second electrode 4. This ionised self-assembled monolayer results in a large concentration gradient of immobile ions of the negative charge, anions, at the second electrode 4.

Figure 2:
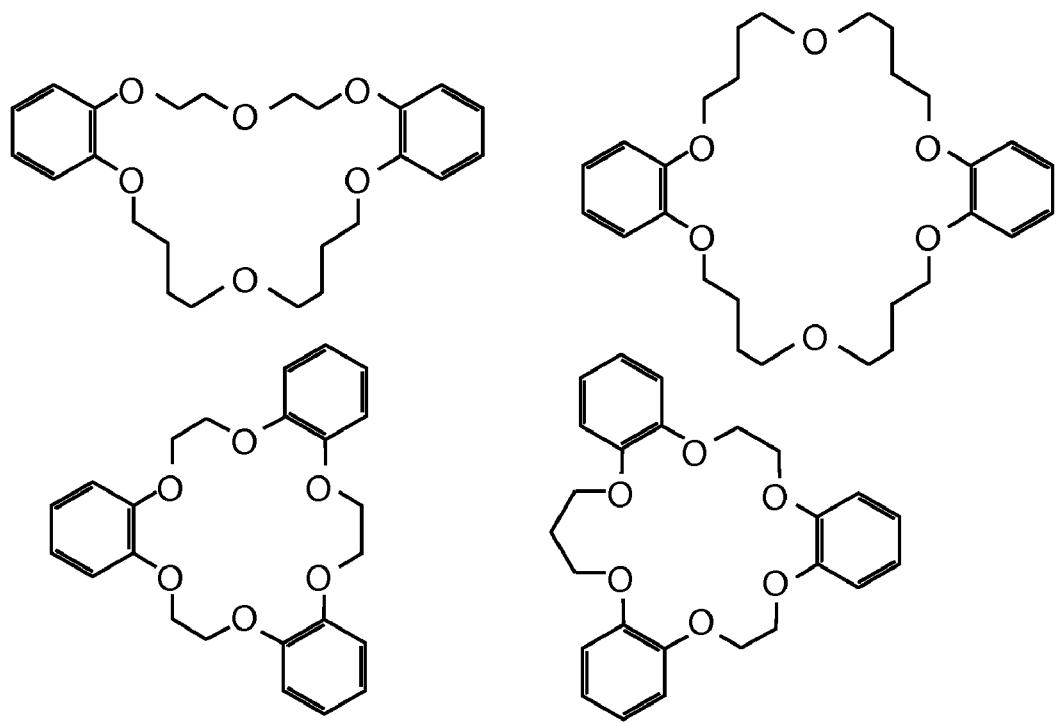
FIG. 2 is a schematic representation of first alternative cation receptor molecules.

FIG. 2 illustrates a couple of molecules useful as a neutral cation receptor in the layer 6. The molecules, which have been described as such by C. J. Pedersen in J. Am. Chem. Soc. 89, 7017 (1967), are cyclic polyethers, also called crown ethers. Many saturated cyclic polyethers containing 5 to 10 oxygen atoms form stable complexes with some or all of the cations of the following substances: Li, Na, K, Rb, Cs, Ag, Au, Ca, Sr, Ba, Cd, Hg, La, Tl, Ce and Pb. Additionally other ions, such as $NH_4^+$ and $RNH_3^+$, may also form stable complexes with these cyclic polyethers. The cyclic polyether molecules with 5 to 10 oxygen atoms are in many cases bulky and voluminous and cannot migrate through the light-emitting layer 5. In addition to the above-described monocyclic polyethers also cryptates could be used.

Figure 3:
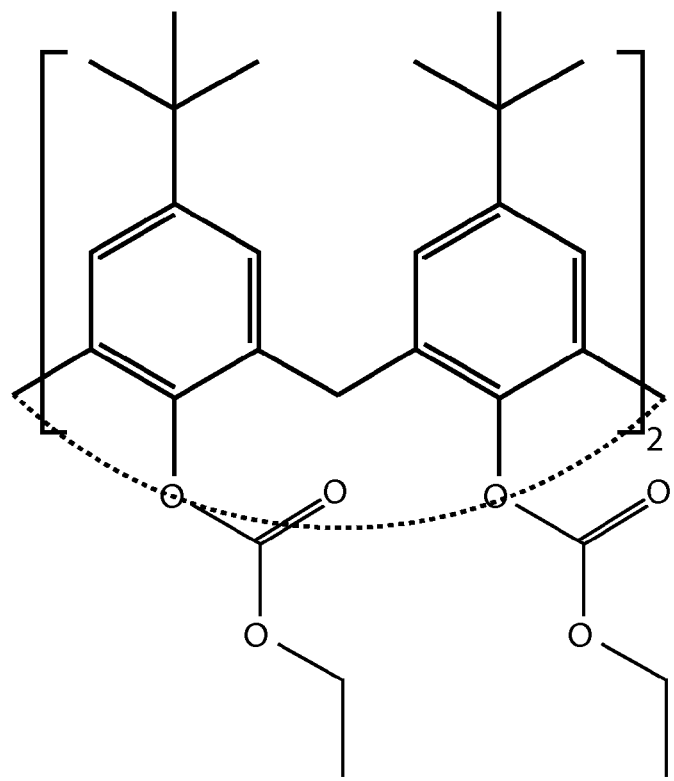
FIG. 3 is a schematic representation of an alternative cation receptor molecule.

FIG. 3 illustrates another example of a molecule useful as a neutral cation receptor. The molecule, which has been described as such by J. Vicens and V. Böhmer "Calixarenes: A versatile class of Macrocyclic Compounds", Topics in Inclusion Science, Kluwer Academic Press, Dordrecht, Vol. 3, 1989, is a calix[4]arene-based cation receptor.

Further the cation receptor could also be provided in the form of a polymeric cation receptor providing a very low risk of migration into the light-emitting layer. One example of such a polymer is a calixarene provided with a polymerisable group. Yet another alternative is to provide the cation receptor as a blend of cation receptor molecules and a matrix.

Yet another example of a molecule useful as a neutral cation receptor is a terphenyl-based cation receptor which is described as such by D. J. Cram and J. M. Cram "Container Molecules and their Guests", Monographs in Supramolecular Chemistry, J. F. Stoddart (Ed.), The Royal Society of Chemistry, London, 1994.

Figure 4:
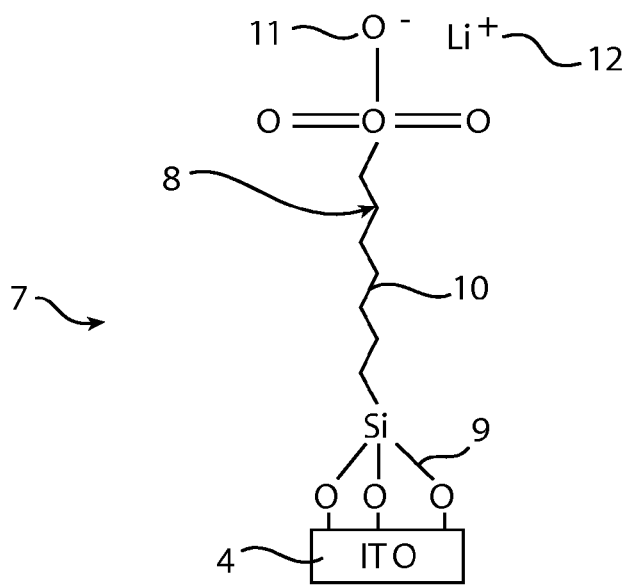
FIG. 4 is a schematic representation of an ionic self-assembled monolayer attached to an electrode of the diode of FIG. 1.

FIG. 4 illustrates an example of a molecule 8, which is useful for forming the layer 7 of ionic self-assembled monolayer molecules. The molecule 8 comprises a bonding group 9, which in the shown molecule 8 is a silane group that has been bonded to the electrode 4 made of ITO. An organic group 10 in the form of an alkyl-chain forming a backbone of the molecule 8 is at one end attached to the bonding group 9 and at the other end attached to the head group 11, which in the shown molecule 8 is a sulfonate group having a negative charge, thus being an anion. The molecule 8 is shown as it is before the initialisation phase and therefore the counterion 12, which in this case is a litium ion, $Li^+$, with positive charge, thus being a cation, is still ionically bound to the headgroup 11.

Further alternative headgroups can be found in, among other documents, an article on ion-channel sensors written by M. Sugawara, K. Kojima, H. Sazawa and Y. Umezawam, Anal. Chem. 59, 2842, 1987.

Figure 5:
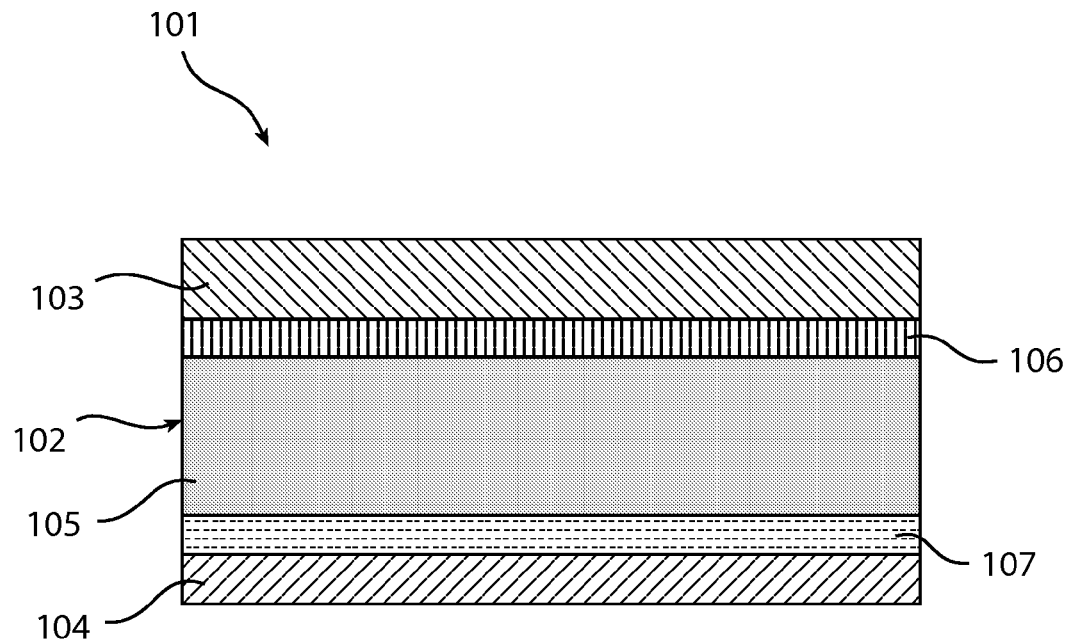
FIG. 5 is a schematic cross-section and shows a light-emitting diode according to a second embodiment of the invention.

FIG. 5 shows a light-emitting diode 101 according to a second embodiment of the invention. The diode 101 has a laminate structure 102 and comprises a first electrode 104, a second electrode 103 and, positioned between the first electrode 104 and the second electrode 103, a light emitting layer 105.

The first electrode 104 works as an anode when the diode 101 is subjected to an electrical field in forward bias. The first electrode 104 is made from an at least partly transparent, high work function electrode material, such as indium tin oxide (ITO). Examples of other alternative transparent electrode materials could be found in, for example, the patent U.S. Pat. No. 5,682,043 to Pei et al. describing light-emitting electrochemical cells in general.

The second electrode 103 works as a cathode when the diode 101 is subjected to an electrical field in forward bias. The second electrode 103 is made from a high work function material, for example gold, silver, aluminium or indium tin oxide (ITO). Other examples of alternative electrode materials could be found in U.S. Pat. No. 5,682,043 (Pei et al).

In case the second electrode 103 is made of a transparent electrode material, such as ITO, the first electrode 104 need not necessarily be made of a transparent material, but could be made of, for example, gold, aluminium or another high work function metal electrode material.

The light-emitting layer 105 could be made of similar materials as the light-emitting layer 5 described above.

A layer 107 of an anion receptor is located between the first electrode 104 and the light-emitting layer 105. The layer 107 of anion receptor contains organic molecules that are bulky and that have affinity for anions, i.e. ions with a negative charge, as will be described later. The layer 107 of anion receptor has captured and immobilized a number of anions as will be described below. There is thus a high concentration of anions adjacent to the first electrode 104.

A layer 106 of ionic self-assembled monolayer molecules is located between the second electrode 103 and the light-emitting layer 105. The ionic self-assembled monolayer molecules each have a fixed ionic headgroup having a positive charge, thus being cations. Originally each headgroup had ionically bound thereto a counterion with a negative charge, i.e. an anion. During an initialisation phase the layer 107 of anion receptor has captured the counterions and has left the layer 106 of ionic self-assembled monolayer molecules with only the headgroup having a positive charge. Thereby a concentration of immobile ions of the positive charge, cations, is formed at the second electrode 103.

Figure 6:
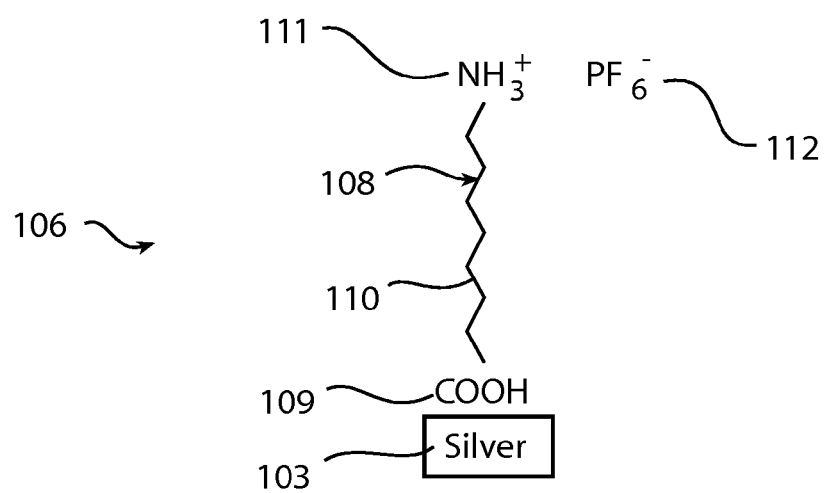
FIG. 6 is a schematic representation of an ionic self-assembled monolayer attached to an electrode of the diode of FIG. 5.

FIG. 6 illustrates an example of a molecule 108, which is useful for forming the layer 106 of ionic self-assembled monolayer molecules. The molecule 108 comprises a bonding group 109, which in the shown molecule 109 is a carboxy group, —COOH, that has been bonded to the electrode 103 made of silver. An organic group 110, functioning as a backbone, in the form of an alkyl-chain is at one end attached to the bonding group 109 and at the other end attached to the head group 111, which in the shown molecule 108 is an ammonium group, —$NH_3^+$, having a positive charge, thus being a cation. The molecule 108 is shown as it is before the initialisation phase and therefore the counterion 112, which in this case is a $PF_6^-$ ion with negative charge, thus being an anion, is still ionically bound to the head group 111. Alternative examples of bonding groups include a hydroxy group, —OH, and an amine group, —$NH_2$, which may be used for bonding a molecule to a second electrode made of platinum. An alternative example of a counterion is triflate (trifluoromethanesulfonate). Further alternative head groups can be found in, among other documents, an article on ion-channel sensors written by M. Sugawara, K. Kojima, H. Sazawa and Y. Umezawam, Anal. Chem. 59, 2842, 1987.

Figure 7:
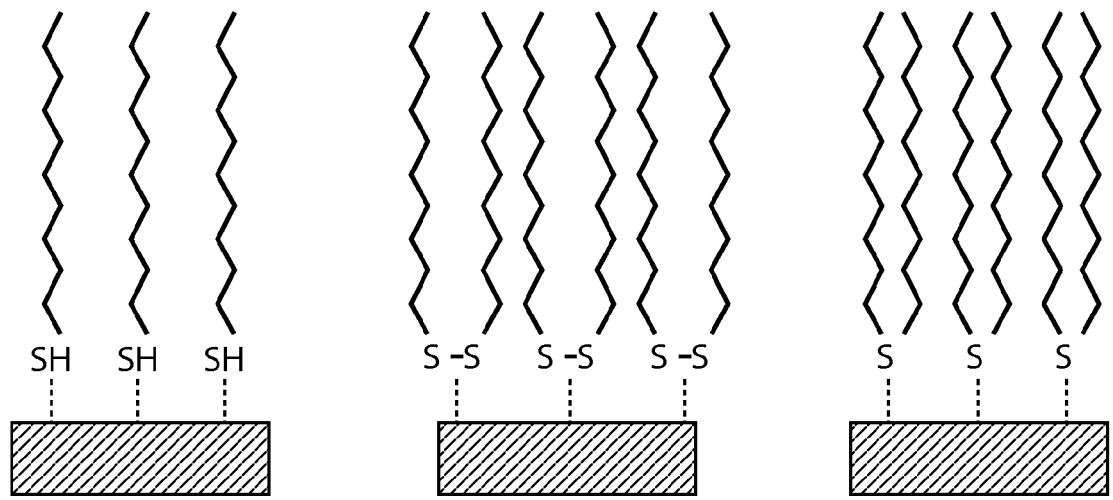
FIG. 7 is a schematic representation of alternative ionic self-assembled monolayers that could be attached to an electrode of a diode similar to that of FIG. 5.

FIG. 7 illustrates three alternatives for molecules that could be used for forming a layer of ionic self-assembled monolayer molecules on a second electrode made of gold. The three alternative self-assembled monolayer molecules are three examples of sulphur containing adsorbates having the ability to attach to a electrode made of gold. Thus the bonding group in these examples will be a sulphur atom. It will be appreciated that the adsorbates contain a bonding group, being sulphur in these cases, an alkyl chain and a head group with a counterion.

Figure 8:
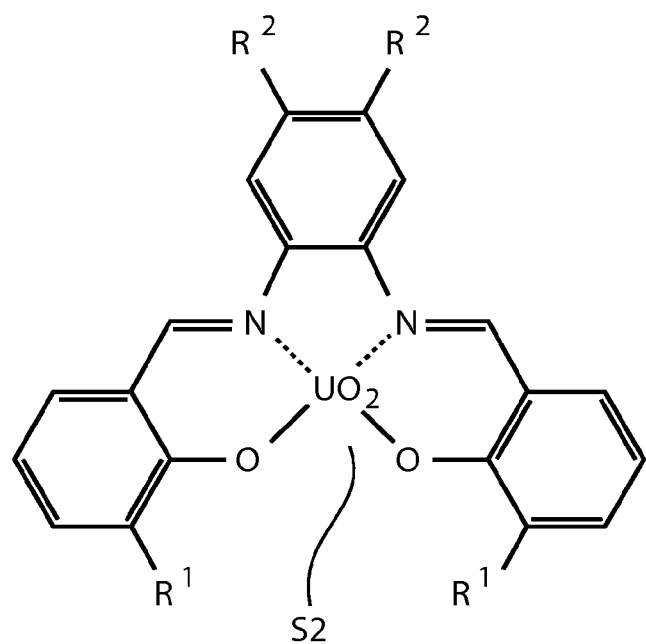
FIG. 8 is a schematic representation of a first alternative anion receptor molecule.

FIG. 8 illustrates an example of a molecule useful as a neutral anion receptor. The molecule, which has been described as such by M. M. G. Antonisse and D. N. Reinhoudt Chem. Comm. p 443 (1998), is based on an immobilized uranyl cation, which is complexed in a salophen unit. The molecule has a site S2 in which the double oxygen atoms allow the capture and immobilization of an anion. The molecule could thus be used to form the layer 107 of anion receptor. Due to the salophen unit, in which the uranyl cation is complexed, the molecule becomes bulky and voluminous and cannot migrate through the light-emitting layer 105.

Figure 9:
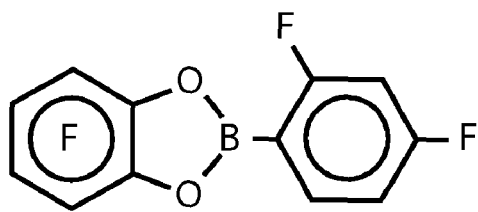
FIG. 9 is a schematic representation of further alternative anion receptor molecules.
Figure 9:
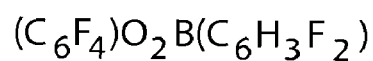
Figure 9:
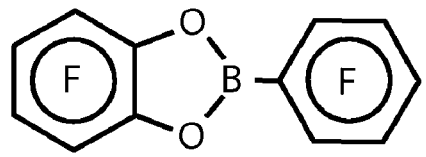
Figure 9:
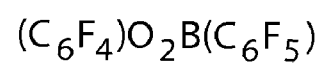
Figure 9:
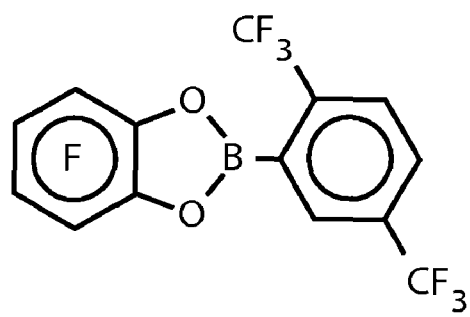
Figure 9:
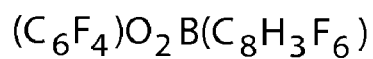
Figure 9:
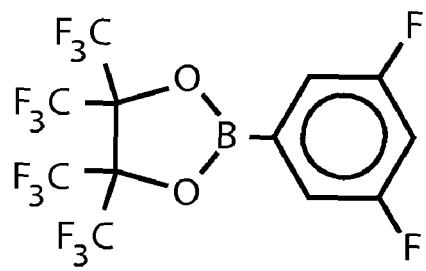
Figure 9:
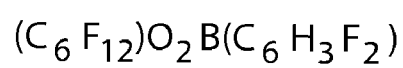

FIG. 9 illustrates a couple of additional examples of molecules useful as a neutral anion receptor. The molecules which, along with a couple of similar molecules that also could be used, have been described as such by H. S. Lee, X. Q. Yang, X. Sun and J. McBreen, J. Power Sources 97, 566 (2001), comprises a boronate group and at least one aromatic substance.

Further the anion receptor could also be provided in the form of a polymeric anion receptor providing a very low risk of migration into the light-emitting layer. Yet another alternative is to provide the anion receptor as a blend of anion receptor molecules and a matrix.

FIG. 10*a*-10*e* show schematically the initial steps of forming a light-emitting diode according to the first embodiment of the invention. The light emitting diode is intended for a lighting application but it will be appreciated that a light-emitting diode forming part of an organic electro-luminescent flat display panel could be formed according to the same principles.

Figure 10A:
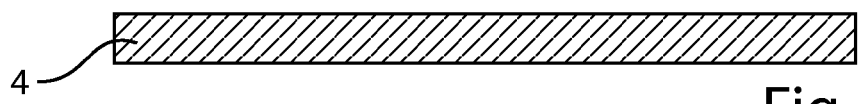
FIG. 10a illustrates a first step in fabricating a laminate for a diode according to the invention.

Firstly the second electrode 4, that is to function as an anode in forward bias, is provided, as is shown in FIG. 10*a*. The second electrode 4 is made of ITO which is a high work function material being substantially transparent. Optionally, and not shown, a layer of PEDOT/PSS, as is done in standard LED, could be applied on the second electrode 4 before the additional layers are applied.

Figure 10B:
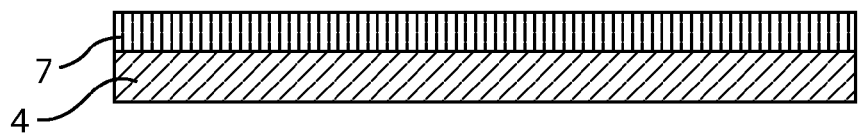
FIG. 10b illustrates a second step in fabricating a laminate for a diode according to the invention.
Figure 10C:
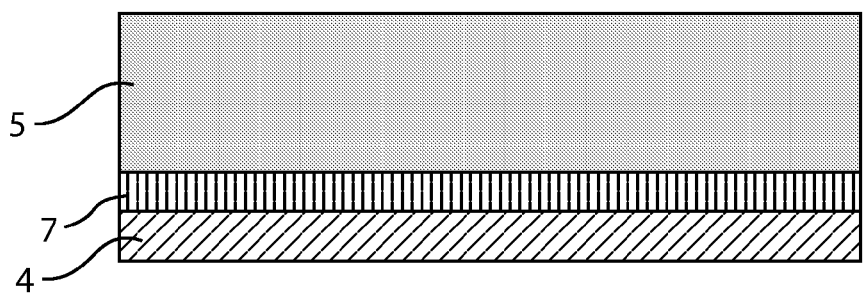
FIG. 10c illustrates a third step in fabricating a laminate for a diode according to the invention.

Then a thin layer 7 of ionic self-assembled monolayer molecules, for instance the ionic self-assembled monolayer molecules described above with reference to FIG. 4, is applied on the second electrode 4 as is shown in FIG. 10*b*. The layer 7 is monomolecular and the thickness of it will thus be essentially the same as the length of the organic group 10. The detailed steps of grafting self-assembled monolayer molecules onto the electrode are per se known and is described in, among other documents, J. B. Brzoska, I. B. Azouz and F. Rondelez, Langmuir 10, 4367, 1994. In a subsequent step, illustrated in FIG. 10*c*, a light-emitting polymer, such as a conjugated polymer is deposited on the layer 7 to form the light-emitting layer 5.

Figure 10D:
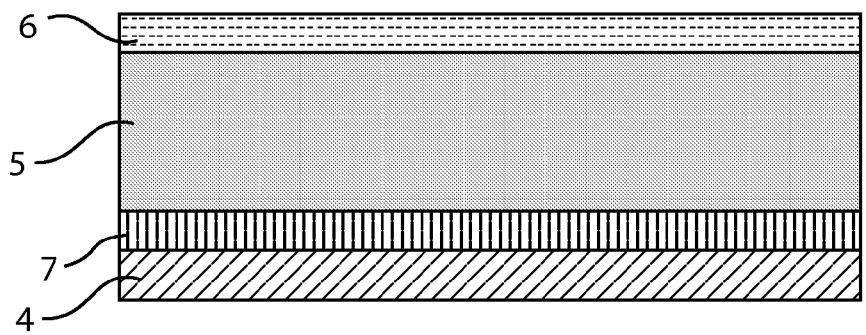
FIG. 10d illustrates a fourth step in fabricating a laminate for a diode according to the invention.

A thin layer 6 of a cation receptor, for instance a cyclic polyether as described above with reference to FIG. 2, is deposited on top of the light-emitting layer 5 as illustrated in FIG. 10*d*. Typically the layer 6 has a thickness in the range of 0.1-10 nm. The cation receptor is processable from a solution and can be applied as a thin layer by, for example, spin coating or inkjet printing. Furthermore the layer 6 of a cation receptor may also be deposited by for example evaporation.

Figure 10E:
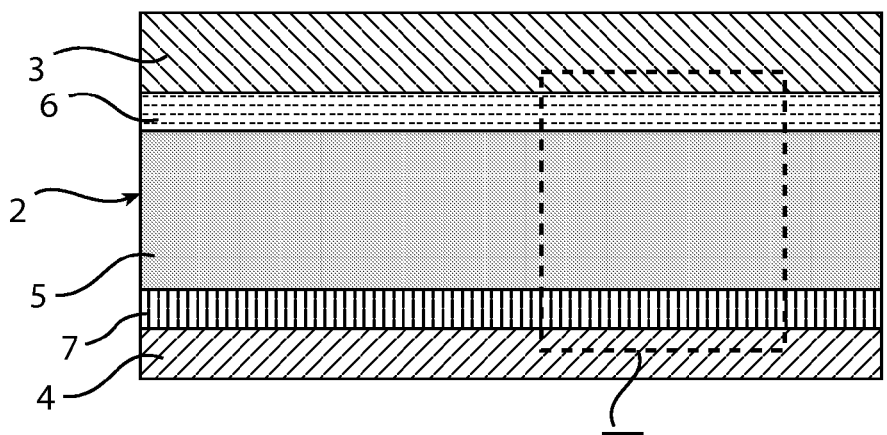
FIG. 10e illustrates a fifth step in fabricating a laminate for a diode according to the invention.

Finally a first electrode 3, that is to function as a cathode in forward bias, is provided, as is shown in FIG. 10*e*. Thereby a laminate 2 has been formed. The thickness of the laminate 2 depends on its function. To function properly as a light-emitting diode the laminate 2 must first be initialised.

FIGS. 11*a*-11*d* show an enlargement of the area XI shown in FIG. 10*e* and illustrate the steps required for initialising the laminate 2 to obtain a light-emitting diode 1.

Figure 11A:
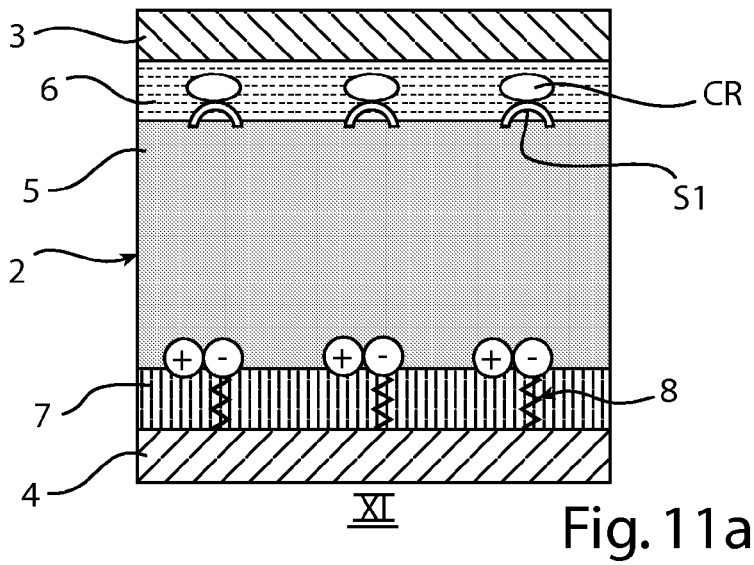
FIG. 11a is an enlarged schematic section view and illustrates the ion configuration of the laminate prior to initialisation.

FIG. 11*a* illustrates the laminate 2 just after it has been formed according to the steps described with reference to FIG. 10*a*-10*e*. As shown in FIG. 11*a* each molecule 8 of the layer 7 of ionic self-assembled monolayer molecules comprises an immobile ion in the form of a head group, which is bound to the backbone of the molecule 8 and has a negative charge (−), i.e. is an anion, and a counterion, which is ionically bound to the head group and has a positive charge (+), i.e. is a cation. As schematically shown in FIG. 11*a* the layer 6 of cation receptor contains a multitude of cation receptor molecules CR, each of which has a site S1 having affinity for cations, i.e. positive ions.

Figure 11B:
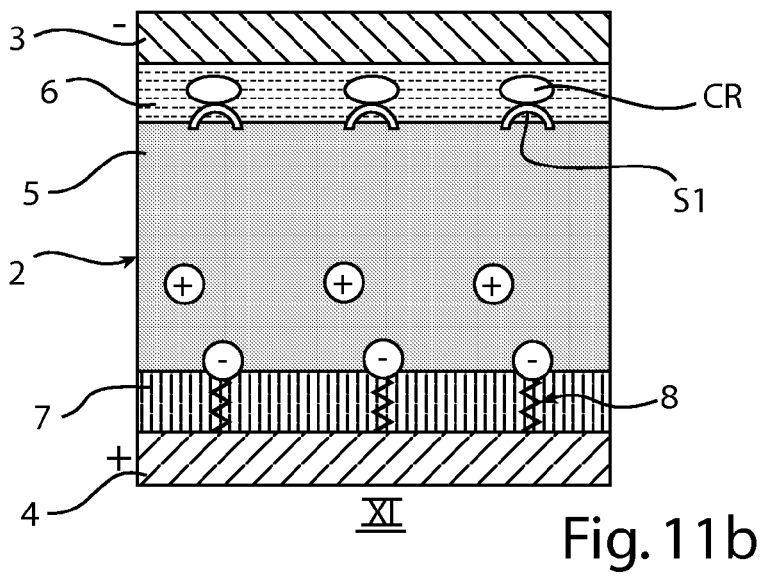
FIG. 11b illustrates the ion travel during initialisation of the laminate.

FIG. 11*b* illustrates the situation just after a voltage has been applied to the laminate 2 to start the initialisation. The first electrode 3 has been biased with a negative voltage, making it the cathode, and the second electrode 4 has been biased with a positive voltage, making it the anode. As can be seen the counterions having a positive charge (+) have started to travel from the layer 7 through the light-emitting layer 5 in the direction of the first electrode 3, the cathode, while the head groups having a negative charge (−) are kept fixed at the second electrode 4, the anode, by the molecules 8. In order to make the counter ions travel quicker the laminate 2, and thus the light-emitting layer 5, is preferably heated to a temperature of about 50-90° C. Further the light-emitting layer 5 could comprise an ion conductor, such as polyethyleneoxide, improving the ion dissociation and the ion transport of the counterions from the self-assembled monolayer molecules.

Figure 11C:
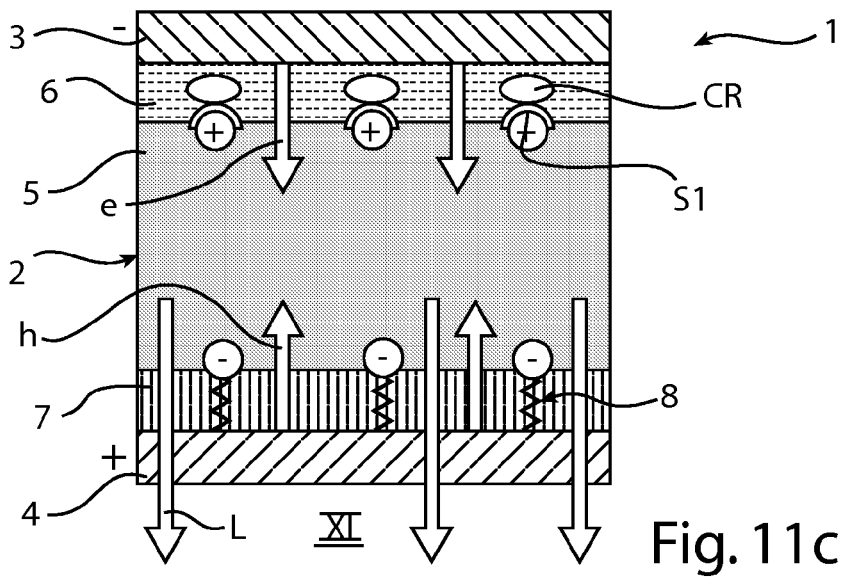
FIG. 11c illustrates the laminate just as the initialisation has been finalized and the final light-emitting diode is ready and operating.

FIG. 11*c* illustrates the laminate 2 at the moment the initialisation has been finalized and the diode 1 is ready and operating. The counter ions having a positive charge (+) have been captured and immobilized by the active sites S1 of the respective cation receptor molecule CR. Thereby a large concentration of positive ions (+) has been obtained at the first electrode 3. Due to the high ion gradient the injection barrier is narrowed and the first electrode 3, being the cathode, has started to emit electrons e. The headgroups having a negative charge (−) are kept at the second electrode 4 by the molecules 8. Thereby a large concentration of negative ions (−) is at hand at the second electrode 4. Due to the high ion gradient the injection barrier is narrowed and the second electrode 4, being the anode, has started to emit holes h. The electrons e and the holes h will then recombine in the matrix of the light-emitting layer 5 under emission of light L, which is emitted via the transparent second electrode 4. It will be appreciated that the layer 7 of ionic self-assembled monolayer molecules is sufficiently thin and transparent to allow the emitted light L to be transmitted there through. In this state light L is thus emitted from the diode 1 according to principles similar to the general principles of a light-emitting electrochemical cell (LEC), the basic principle of which is per se known from Q. B. Pei et al, Science 269, 1086, 1995, J. Gao, G. Yu, A. J. Heeger, Appl. Phys. Lett. 71, 1293, 1997 and other documents.

Figure 11D:
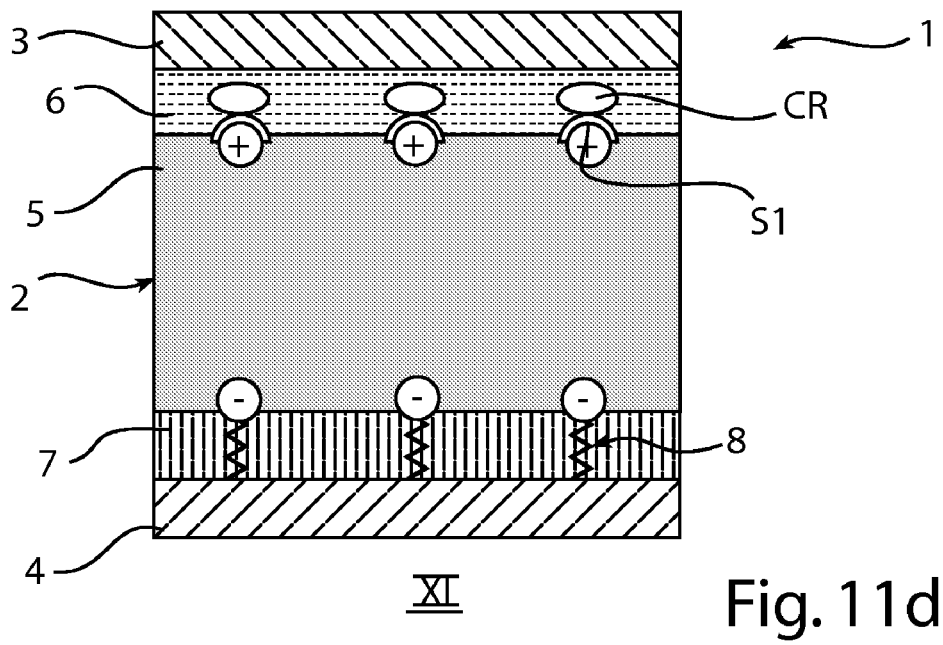
FIG. 11d illustrates the diode at rest, when there is no bias.

FIG. 11d shows the final light-emitting diode 1 at rest, i.e. when there is no voltage applied. As can be seen the cation receptor molecules CR still hold on to the counter ions having a positive charge (+), i.e. the cations. Since the molecules CR are bulky, i.e. have a large volume, they will not be able to migrate into the matrix of the light-emitting layer 5 but will remain adjacent to the first electrode 3. The head groups having a negative charge (−), i.e. the anions, are still kept at the second electrode by the molecules 8. Since the molecules 8 are bonded to the second electrode 4 the head groups will not be able to migrate into the light-emitting layer 5, but will remain adjacent to the second electrode 4. Thus the large ion gradients created during the initialisation described with reference to FIG. 11b to 11c is maintained also after the voltage has been removed. The cations and anions are firmly immobilized at the respective electrode 3, 4 and will not be released due to high temperatures. The next time of applying a forward bias, by which is meant that the first electrode 3 is biased with a negative voltage to become cathode and the second electrode 4 is biased to with a positive voltage to become anode, to the light emitting diode 1, the ion gradients are already in place, since the ions are immobilized, and light emission will start immediately. Thus the diode 1 provides a very quick response to a forward bias and a low sensitivity to high temperatures, time dependent degeneration etc.

Figure 12:
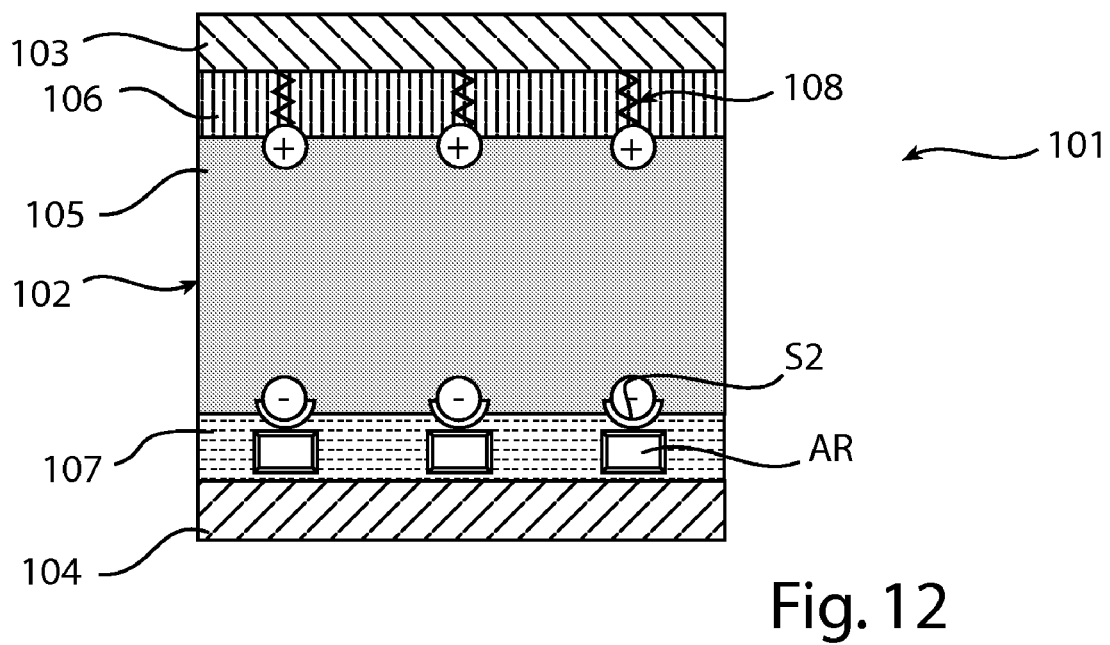
FIG. 12 is an enlarged schematic section view and illustrates the light-emitting diode according to the second embodiment of the invention when the diode is at rest and when there is no bias.

FIG. 12 shows the light-emitting diode 101 according to the second embodiment after initialisation and at rest. The initialisation has been performed according to similar principles as described with reference to FIG. 11a to 11c. During the initialisation the first electrode 104 was biased with a positive charge, making it the anode, and the second electrode 103 was biased to a negative charge, making it the cathode. Due to this bias the counter ions, having a negative charge (−), left the molecules 108 and were captured by sites S2 of respective anion receptor molecules AR being part of the layer 107 of anion receptor. As can be seen in FIG. 12 the anion receptor molecules AR still hold on to the counter ions having a negative charge (−), i.e. the anions. Since the molecules AR are bulky, i.e. have a large volume, they will not be able to migrate into the matrix of the light-emitting layer 105 but will remain adjacent to the first electrode 104. The headgroups, having a positive charge (+), remain fixed adjacent to the second electrode 103 due to the molecules 108 being bonded thereto. Thus a concentration of immobilized cations has been formed at the second electrode 103 and a concentration of immobilized anions has been formed at the first electrode 104. These large ion gradients created during the initialisation are maintained also after the voltage has been removed. The next time of applying a forward bias, by which is meant that the first electrode 104 is biased with a positive voltage to become anode and the second electrode 103 is biased to with a negative voltage to become cathode, to the light emitting diode 101, the ion gradients are already in place, since the ions are immobilized, and light emission will start immediately. Thus the diode 101 provides a very quick response to a forward bias and a low sensitivity to high temperatures, time dependent degeneration etc.

Figure 13A:
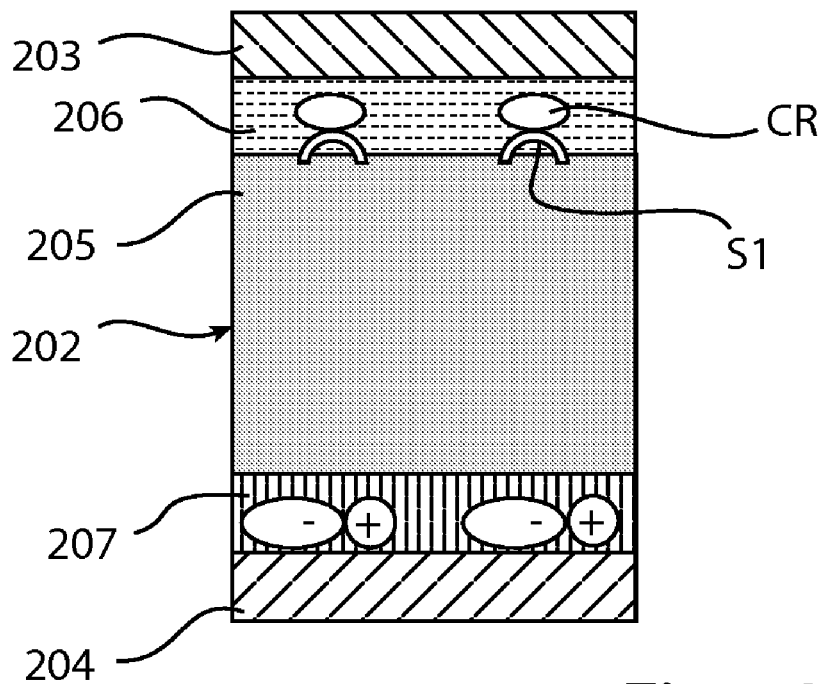
FIG. 13a is an enlarged schematic section view and illustrates a laminate according to a third embodiment prior to initialisation.

FIG. 13a illustrates a laminate 202 prior to initialisation. The laminate 202 comprises a first electrode 203, a second electrode 204 and, positioned between the first electrode 203 and the second electrode 204, a light-emitting layer 205. Both electrodes 203, 204 are high work function electrodes. A layer 206 of a cation receptor is located between the first electrode 203 and the light-emitting layer 205. The layer 206 comprises cation receptor molecules CR, each of which has a site S1 having affinitity for cations, i.e. positive ions. A PEDOT/PSS layer 207 is positioned between the second electrode 204 and the light-emitting layer 205. The PEDOT/PSS layer 207 comprises movable cations, i.e. positive ions (+), and polymeric anions, i.e. ions that have a negative charge (−) and are immobile due to their bulkiness. $H^+$ and $Na^+$ could be mentioned as examples of movable cations.

Figure 13B:
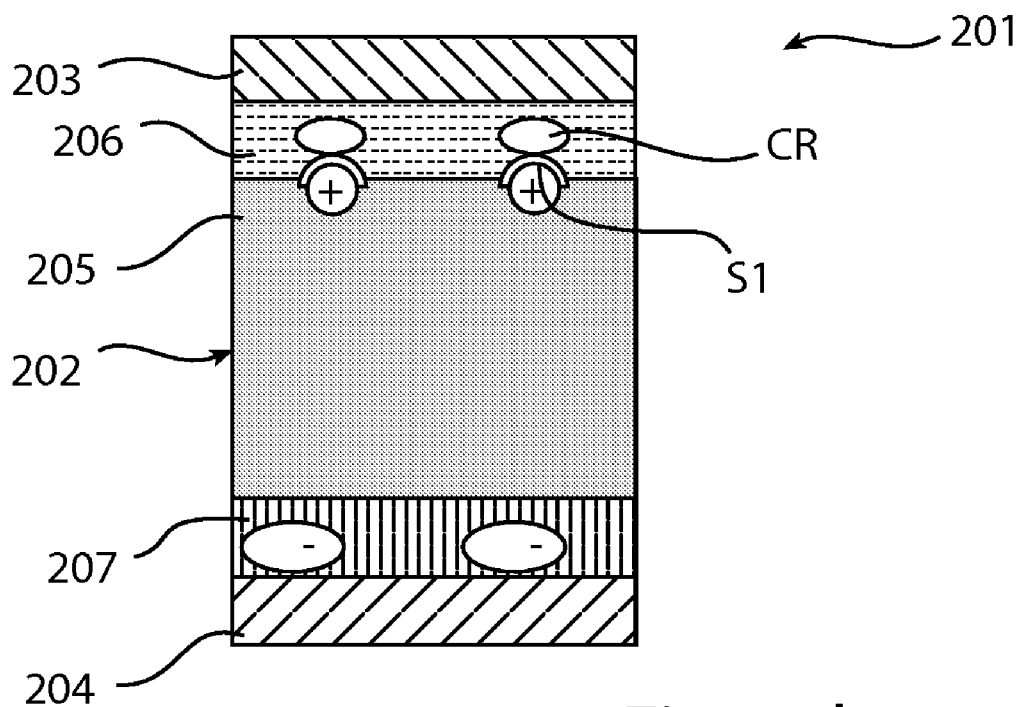
FIG. 13b illustrates a light emitting diode according to the third embodiment after initialisation and at rest.

FIG. 13b illustrates a light-emitting diode 201 after initialisation of the laminate 202 shown in FIG. 13a and at rest. During the initialisation, during which the first electrode 203 was biased with a negative voltage to become the cathode and the second electrode 204 was biased with a positive voltage to become the anode, the movable cations, being the counterions of the immobile anions, migrated from the PEDOT/PSS layer 207 towards the first electrode 203 and got captured and immobilized by the active sites SI of the respective cation receptor molecule CR. Thus a concentration of immobilized cations have been formed at the first electrode 203. The immobile anions are too bulky to migrate in any direction and remain in the PEDOT/PSS layer 207. Thus a concentration of immobile anions has been formed at the second electrode 204. The next time of applying a forward bias, by which is meant that the first electrode 203 is biased with a negative voltage to become cathode and the second electrode 204 is biased to with a positive voltage to become anode, the ion gradients are already in place and light emission will start immediately. Thus the diode 201 provides a very quick response to a forward bias and a low sensitivity to high temperatures, time dependent degeneration etc.

It will be appreciated that numerous variants of the above-described embodiments are possible within the scope of the appended patent claims.

For example it is described above that the electrode 3, 103 respectively being the cathode in forward bias, is a high work function electrode. It will be appreciated that the light-emitting diode would work also in the event the cathode electrode was instead a low work function electrode. A low work function electrode, such as a barium electrode, is generally very sensitive to environmental conditions and time dependent degradation and therefore it is a great advantage of the present invention that it permits the use of a high work function electrode, such as a gold, silver or ITO electrode, as cathode since such electrode materials are generally much less sensitive to contact with oxygen etc.

Above a couple of examples of cation and anion receptors are illustrated with reference to FIGS. 2, 3, 8 and 9. It will be appreciated that other alternative receptors are also available. For example the group generally referred to as crown ethers contains a large number of substances that could be used.

Additionally the molecules shown in FIGS. 4, 6 and 7 that could be used to form the layer 7, 106, respectively, of ionic self-assembled monolayer molecules are only examples and other alternatives are possible.

Above it has been described how an ionic self-assembled monolayer is attached directly to an electrode to form a layer on the electrode. It will be appreciated that it is also possible to use thin coupling layers, for example made of gold, with the purpose of improving the attachment of the monolayer to the electrode.

Preferably the molecules making up both the anion and cation receptors have a voluminous organic molecule part providing the necessary "bulkiness" making the receptor unable to migrate into the light-emitting layer. Thereby it is ensured that the immobilized ions remain adjacent to the respective electrode. To provide the necessary sites attracting anions or cations, as the case may be, the molecule making up the receptor is often provided with oxygen containing groups and sometimes also other inorganic groups providing the normally neutral receptor molecule with a site having a charge distribution of such kind that either anions or cations are attracted to it.

It is possible to make both the first electrode and the second electrode of the material indium tin oxide (ITO), or another high work function material being at least partly transparent, and thus obtain a diode in which light emission occurs through both electrodes.

The light emitting diodes 1 and 101 according to the first and second embodiments are quite similar. The main difference is that in the diode 1 the layer 7 of ionic self-assembled monolayer molecules is attached to the electrode 4 that works as an anode in forward bias, whereas in the diode 101 the layer 106 of ionic self-assembled monolayer molecules is attached to the electrode 103 that works as a cathode in forward bias. The choice between the diode 1 and the diode 101 could be dictated by the desired materials in the anode and the cathode and the existence of suitable molecules to bond to the respective materials. If, for example, the cathode is to be made of gold and a suitable molecule having a sulphur bonding group is available, then it could be preferable to make a diode 101 according to the second embodiment, thus having the layer 106 of self-assembled monolayer molecules attached to the second electrode 103. If, on the other hand, the anode is to be transparent and a suitable molecule having a silane bonding group is available then it could be preferable to make a diode 1 according to the first embodiment, thus having the layer 7 of self-assembled monolayer molecules attached to the second electrode 4, which could be made of ITO.

The organic group 10, 110 of the respective molecule 8, 108 could be an alkyl chain with 4-30 carbon atoms and could be branched or unbranched. A too long alkyl chain would result in an unwanted insulating effect at the surface of the electrode. A too short alkyl chain would not result in a well defined self-assembled monolayer. In the examples shown in FIG. 4 and FIG. 6 each molecule 8; 108 has only one bonding group and one headgroup. It will be appreciated that each molecule could comprise several bonding groups and/or several headgroups.

Above a couple of possible bonding groups 9, 109 have been described in conjunction with a surface 4, 103 to which the respective bonding group could be bonded. It will be appreciated that there are other alternatives as well. Examples of alternative bonding groups, that could be used to bond a molecule to a surface, include: alkyltrichlorosilanes or alkyltri(m)ethoxysilanes for bonding on oxidic surfaces such as $SiO_2$ or $Al_2O_3$, alcohols or amides for bonding on a Pt surface, fatty acids for bonding on an Ag or a $SiO_2$ surface, 1-alkenes for bonding on a Si surface, and alkyl(di)phosphonic acids for bonding on a mica surface.

In order to provide the light-emitting diode with electrical protection, mechanical scratch protection or protection against water it could be provided with a thin protective top coating, such as a thin polymer layer provided on the first electrode or even hermetically encapsulating the entire light-emitting diode.

With reference to FIG. 11a-d and FIG. 12 it is described that self-assembled monolayer molecules comprise ionic head groups which serve as immobile ions of a second charge. With reference to FIG. 13a-b it is on the other hand described that bulky polymer molecules of a PEDOT/PSS layer themselves are ionic and serve as immobile ions of a second charge. In both cases counterions, having the first charge being opposite to said second charge, are movable prior to initialisation and get captured by a layer of an ion receptor. It will be appreciated that there are further alternatives to provide immobile ions of a second charge along with counterions having a first charge and being movable prior to initialisation of the diode. For instance the immobile ions and the movable counterions could, initially, be comprised in a special ion layer, separate from the layer of the ion receptor and the PEDOT/PSS layer. Yet another alternative is to have the immobile ions and the movable counterions form part of the light-emitting layer and thus to be incorporated in the matrix of that layer prior to initialisation. In the latter case, however, no concentration of ions of the second charge will be obtained at the second electrode, which may not be necessary since a concentration of immobilized ions of the first charge at the first electrode may sometimes be sufficient.

Thus the ions used should form, prior to initialisation, ion pairs each including one immobile ion, having a second charge, and one movable counterion, having a first charge. The immobile ions should be located at some distance from the layer of the ion receptor, in the direction of the second electrode, in order to provide the desired ion gradient after initialisation. The immobile ions could, for example, be immobile due to forming a part of self-assembled monolayer molecules, due to forming a part of bulky organic or polymeric molecules, due to forming a part of bulky inorganic structures, such as complexes, or due to another measure known to the skilled man.

It will be appreciated that the immobile ions could be of many different types. For instance the immobile ions could be polymeric structures in which ions, having the second charge, are incorporated in, or attached to, a polymer carbon chain. Yet another alternative is to use immobile ions in the form of ions, having the second charge, incorporated in an organic molecule with a bulky structure. An example of the later alternative is the incorporation in a suitable matrix of transition metal complexes, such as ruthenium tris-bipyridine, $[Ru(bpy)_3]^{2+}$, combined with a suitable counter ion as is described by P. McCord and A. J. Bard, J. Electronal. Chem., 91, 318, 1991. The light-emitting layer could thus also comprise an insulating layer mixed with charged triplet emitter molecules.

It will further be appreciated that immobile ions and movable counterions could be included in several layers of a laminate prior to initialisation.

To summarize a light-emitting diode 1, 101, 201 has a first electrode 3, 104, 203 a second electrode 4, 103, 204 and a light-emitting layer 5, 105, 205. A layer 6, 107, 206 of an ion receptor CR, AR is positioned between the first electrode 3, 104, 203 and the light-emitting layer 5, 105, 205. Immobile ions of a second charge are positioned between the second electrode 4, 103, 204 and the first electrode 3, 104, 203. The immobile ions initially had counterions of a first charge. The layer 6, 107, 206 has captured the counterions, thereby forming a concentration of immobilized ions at the first electrode 3, 104, 203. The ion gradient provide for injection of electrons e and holes h resulting in emission of light L.

A diode 1, 101, 201 is manufactured by exposing a laminate 2, 102, 202 of the above structure to a forward bias making the ion receptor CR, AR capture the counterions.

The invention claimed is:

1. A light-emitting diode comprising:
   a first electrode;
   a second electrode;
   a light-emitting layer being positioned between the first electrode and the second electrode;
   a receptor layer of an ion receptor having affinity for ions of a first charge, the receptor layer being positioned between the first electrode and the light-emitting layer;
   a further layer of monolayer molecules including immobile ions of a second charge, the second charge being opposite to said first charge, wherein the further layer is between the second electrode and the light-emitting layer such that the immobile ions are positioned between the first electrode and the second electrode at a distance from the receptor layer in the direction of the second electrode,
   wherein the further layer includes counterions having said first charge, the counterions being bound to the immobile ions,
   wherein the counterions are configured to move towards the receptor layer upon application of a voltage between the first electrode and the second electrode, and the receptor layer is configured to capture and immobilize the counterions thereby forming a concentration of immobilized ions of the first charge at the first electrode to form an ion gradient for injection of electrons and holes into the light-emitting layer when a further voltage is applied between the first electrode and the second electrode.

2. The light emitting diode according to claim 1, wherein said receptor layer comprises cation receptor molecules capturing the counterions, wherein the counterions have a positive charge, the first electrode being a cathode and the second electrode being an anode under forward bias conditions.

3. The light emitting diode according to claim 1, wherein said receptor layer comprises anion receptor molecules capturing for capturing the counterions, wherein the counterions have a negative charge, the first electrode being an anode and the second electrode being a cathode under forward bias conditions.

4. The light-emitting diode according to claim 1, wherein the first electrode is a cathode under forward bias conditions and comprises a high work function material.

5. The light-emitting diode according to claim 1, wherein the monolayer molecules comprise ionic self-assembled monolayer molecules including fixed ionic headgroups having the second charge, the further layer retaining the ionic headgroups, thereby forming a concentration of immobile ions of the second charge at the second electrode.

6. The light-emitting diode according to claim 5, wherein each of the self-assembled monolayer molecules comprises the fixed ionic headgroup, a bonding group for fixing the molecule to the second electrode, and an organic group for holding said fixed ionic headgroup attached to the bonding group and thus attached to the second electrode.

7. The light-emitting diode according to claim 1, wherein the receptor layer comprises bulky organic molecules each having a site for attracting ions.

8. The light-emitting diode according to claim 1, wherein the first electrode and the second electrode, the receptor layer, and the light-emitting layer form a laminate, at least one electrode of the first electrode and the second electrode being made from transparent materials such that the light emitted by the light-emitting diode is transmitted through said at least one electrode.

9. The light-emitting diode according to claim 1, wherein the light-emitting layer comprises an organic material.

10. A method of forming a light-emitting diode having a first electrode, a second electrode and a light-emitting layer being positioned between the first electrode and the second electrode, the method comprising the acts of:
    providing, between the first electrode and the light-emitting layer, a receptor layer of an ion receptor having affinity for ions of a first charge;
    providing, between the first electrode and the second electrode, at a distance from the receptor layer in the direction of the second electrode, a further layer of monolayer molecules including immobile ions of a second charge, the second charge being opposite to said first charge, wherein the further layer includes counterions having said first charge; and
    applying an electrical field over the first electrode and the second electrode to make one electrode of said first electrode and said second electrode a cathode and another electrode of said first electrode and said second electrode an anode, wherein the counterions move towards the receptor layer in response to the electrical field and the receptor layer captures and immobilizes the counterions thereby forming a concentration of immobilized ions of the first charge at the first electrode to form an ion gradient for injection of electrons and holes into the light-emitting layer when the light-emitting diode is exposed to a forward bias.

11. The method according to claim 10, further comprising the act of heating the light-emitting layer during said applying act.

12. The method according to claim 10, wherein the monolayer molecules comprise ionic self-assembled monolayer molecules including fixed ionic headgroups having the second charge, the further layer retaining the ionic headgroups, thereby forming a concentration of immobile ions of the second charge at the second electrode.

* * * * *